(12) United States Patent
Duncan et al.

(10) Patent No.: US 12,238,900 B2
(45) Date of Patent: Feb. 25, 2025

(54) STANDALONE AND SCALABLE LIQUID COOLING MODULES

(71) Applicant: Dell Products L.P., Round Rock, TX (US)

(72) Inventors: Tyler Baxter Duncan, Austin, TX (US); Anthony Middleton, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/971,348

(22) Filed: Oct. 21, 2022

(65) Prior Publication Data

US 2024/0138120 A1  Apr. 25, 2024
US 2024/0237299 A9  Jul. 11, 2024

(51) Int. Cl.
*H05K 7/20* (2006.01)

(52) U.S. Cl.
CPC ..... *H05K 7/20763* (2013.01); *H05K 7/20272* (2013.01); *H05K 7/20718* (2013.01)

(58) Field of Classification Search
CPC ........... H05K 7/20709–20827; H05K 7/20263
See application file for complete search history.

(56) References Cited

U.S. PATENT DOCUMENTS

| | | | |
|---|---|---|---|
| 7,864,530 B1 * | 1/2011 | Hamburgen | H05K 7/2079 165/110 |
| 10,257,960 B1 * | 4/2019 | Banerjee | H05K 7/203 |
| 2010/0236772 A1 * | 9/2010 | Novotny | H05K 7/20836 165/287 |
| 2011/0100618 A1 * | 5/2011 | Carlson | H05K 7/2079 165/104.33 |
| 2011/0290448 A1 * | 12/2011 | Campbell | H05K 7/20318 165/181 |
| 2013/0205822 A1 * | 8/2013 | Heiland | G01M 3/04 62/259.2 |
| 2019/0327861 A1 | 10/2019 | Duncan et al. | |
| 2021/0100134 A1 * | 4/2021 | Gao | H05K 7/20781 |
| 2021/0274683 A1 * | 9/2021 | Lee | H05K 7/20254 |
| 2021/0378149 A1 * | 12/2021 | Gao | H05K 7/20736 |

FOREIGN PATENT DOCUMENTS

CN  110475458 A  * 11/2019  ........ H05K 7/20318
WO  WO-2021181153 A1 * 9/2021  ............ F24F 11/32

* cited by examiner

*Primary Examiner* — Zachary Pape
(74) *Attorney, Agent, or Firm* — Chamberlain, Hrdlicka, White, Williams & Aughtry; Aly Z. Dossa

(57) ABSTRACT

Multiple systems for providing liquid and air cooling for IT components is disclosed. The modular system for cooling Information Technology (IT) includes a first module with at least one dry cooler that supplies liquid cooling to at least one liquid heat exchange device, and a second module with at least one liquid heat exchange device that provides liquid cooling to a facility with one or more IT units. The modular system may also provide cooling liquid to an air to liquid heat exchange device of the facility.

8 Claims, 9 Drawing Sheets

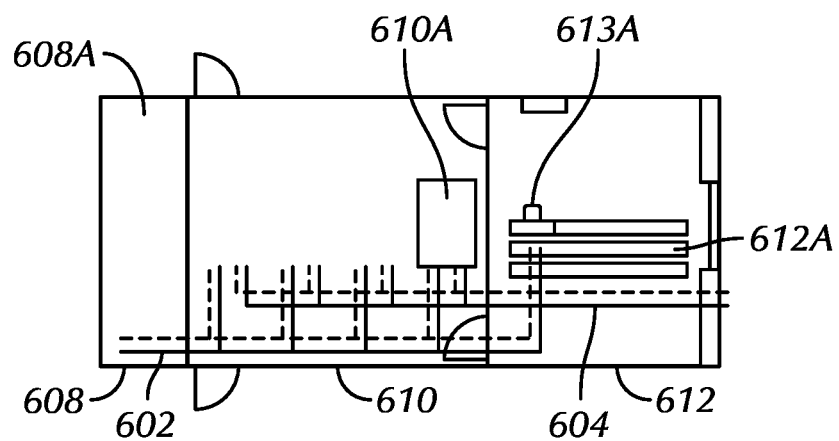
FIG. 6.1
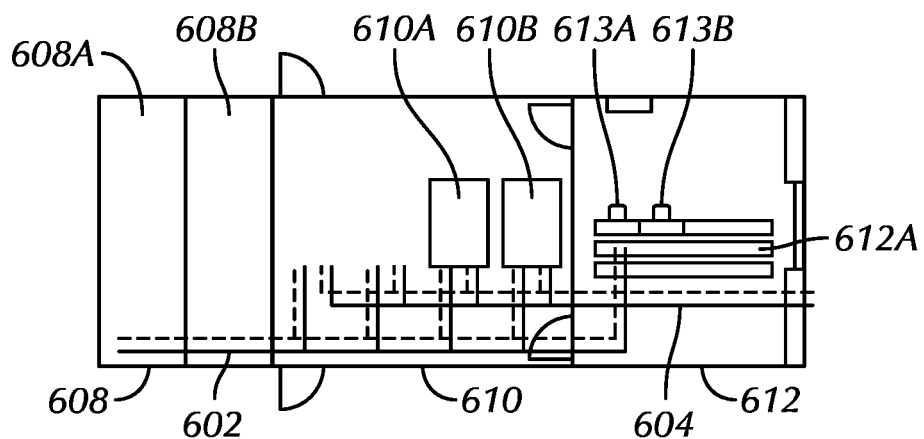
FIG. 6.2

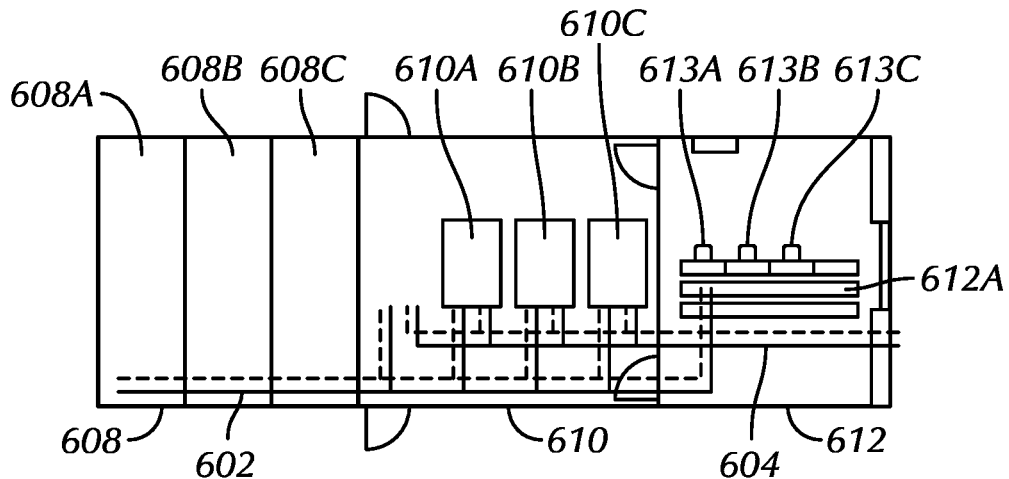
FIG. 6.3
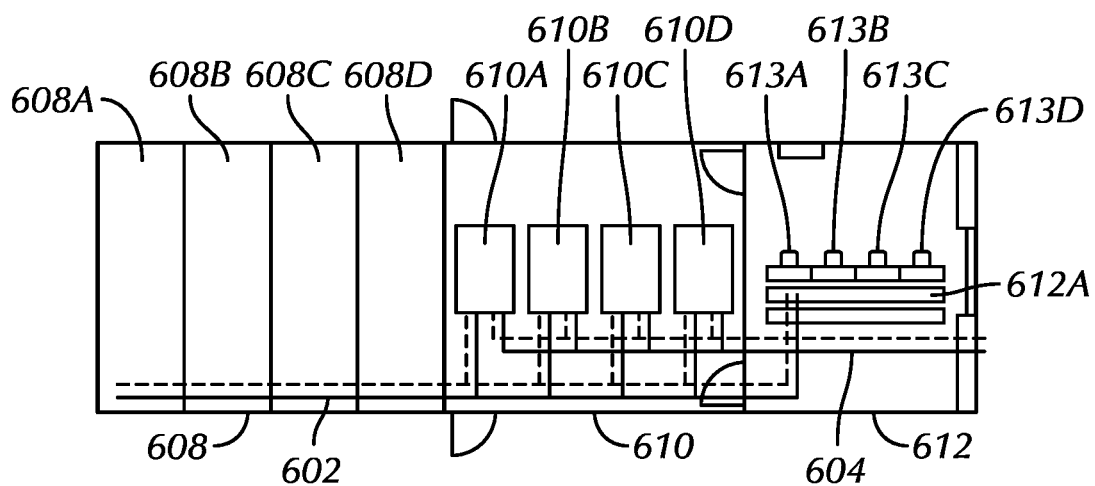
FIG. 6.4

STANDALONE AND SCALABLE LIQUID COOLING MODULES

BACKGROUND

The heterogeneous Information Technology (IT) environments witnessed today often require a mixture of air and liquid cooling. With various technologies prevalent in the liquid cooling space, custom solutions, such as using commercially available industrial heating, ventilation and air conditioning (HVAC) units, are often sized and developed per application load and/or targeted toward a specific supply medium. The custom solutions may require additional custom engineering for each deployment and/or refresh cycle of the IT.

In addition, the ratio of liquid cooling to air cooling often varies greatly from one system to another. Mixed environments that utilize liquid cooled and air cooled racks typically result in custom engineering for each solution. Mixed environments may also result in an un-optimized cooling solution that either leaves capacity, or is short on capacity, either in the liquid or the air cooling side. This problem may be amplified as IT is refreshed by the constant manual tuning of the cooling system that may be required. Further, in mixed environments, the presence of personnel may affect the air temperatures, resulting in temperatures that are detrimental to the IT and/or not safe for the personnel.

SUMMARY

In one aspect, embodiments described herein relate to a modular system for cooling Information Technology (IT) that includes a first module with at least one dry cooler that supplies liquid cooling to at least one liquid heat exchange device, and a second module with at least one liquid heat exchange device that provides liquid cooling to a facility with one or more IT units. The modular system may also provide cooling liquid to an air to liquid heat exchange device of the facility.

In another aspect, embodiments described herein relate to a device for cooling IT that includes that includes a first module with at least one dry cooler that supplies liquid cooling to at least one liquid heat exchange device, and a second module with at least one liquid heat exchange device that provides liquid cooling to a facility with one or more IT units. The device may also provide cooling liquid to an air to liquid heat exchange device of the facility.

BRIEF DESCRIPTION OF DRAWINGS

Certain embodiments of the technology will be described with reference to the accompanying drawings. However, the accompanying drawings illustrate only certain aspects or implementations of the technology by way of example and are not meant to limit the scope of the claims.

FIGS. 6.1-6.4 show diagrams demonstrating the scalability of a system in accordance with one or more embodiments of the technology.

DETAILED DESCRIPTION

Figure 1:
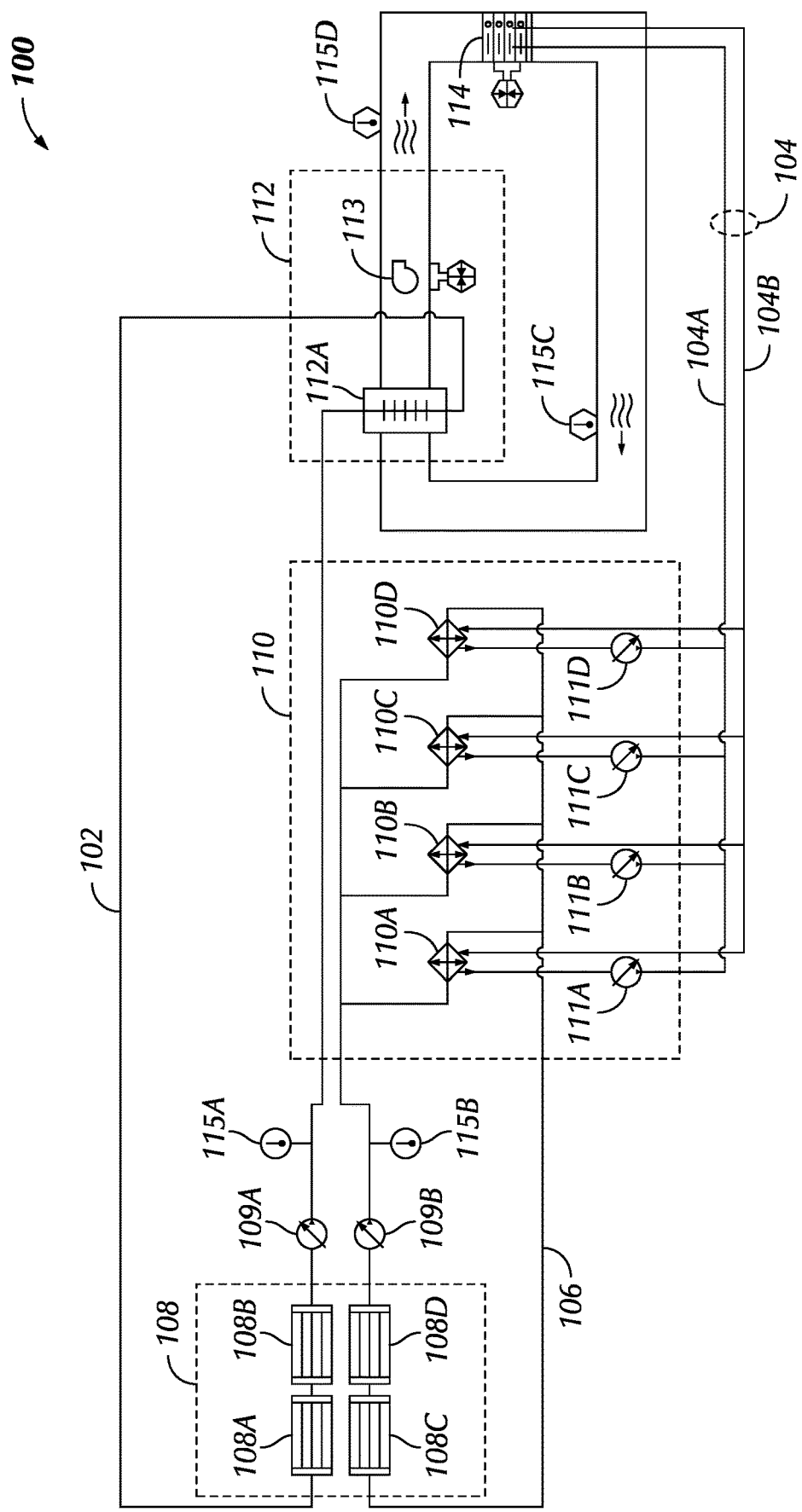
FIG. 1 shows a diagram of a multi-loop system in accordance with one or more embodiments of the technology.

Specific embodiments will now be described with reference to the accompanying figures. In the following description, numerous details are set forth as examples of the technology. It will be understood by those skilled in the art that one or more embodiments of the present technology may be practiced without these specific details and that numerous variations or modifications may be possible without departing from the scope of the technology. Certain details known to those of ordinary skill in the art are omitted to avoid obscuring the description.

In the following description of the figures, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment, which may be implemented in addition to, in conjunction with, or in place of the embodiments described with regard to a corresponding like-named component in any other figure.

In general, embodiments disclosed herein are directed to cooling solutions in an IT environment using cooling modules. In this context, Information Technology (IT) refers to racks, servers, storage, networking components, and/or any other computational equipment that may benefit from liquid and/or air cooling.

Embodiments of the cooling solutions include cooling modules that may have all the required power transformation and controls for operation and operate autonomously. Such cooling modules may be assembled with the IT at the factory and delivered to the site as a single unit, or the one or more of the cooling modules may be connected to an IT system (provided or previously existing) at a customer site as part of a site assembled solution.

Embodiments disclosed herein use multiple closed liquid cooling loops (also referred to as loops) to establish the liquid cooling. Embodiments may utilize one or more compressor-less dry coolers in a primary loop. Optionally, the dry coolers may use evaporative cooling for heat rejection to an outside environment. Embodiments of the cooling loops also include liquid heat exchange devices (also referred to as coolant distribution units (CDUs)). The cooling liquid provided by the dry coolers may be used to remove the heat from the CDUs. The CDUs may be a part of a secondary cooling loop to provide direct liquid cooling to the IT.

Embodiments may also include air to liquid heat exchange devices to provide the desired air cooling. An air to liquid heat exchange device may be included in either the primary or secondary cooling loops.

The embodiments disclosed herein are directed to a multi-loop liquid and air cooling system with modular and scalable sections to accommodate a multitude of heterogeneous IT deployments. The modules include a dry cooling module, a liquid loop interface module, and an air to liquid exchange module to provide liquid and air cooling to IT, or an IT module. Each module may be scaled to accommodate the overall cooling needs of the IT. Further, one or more of the modules may be transported to the site for the IT.

FIG. 1 shows a diagram of a multi-loop system in accordance with one or more embodiments disclosed herein. The multi-loop system (100) includes a primary loop (102), a secondary loop (104), and a third loop (106). Each of these components and/or sections is described below.

The multi-loop system (100) includes a dry cooling section (108), a liquid loop interface (110), and an air to liquid exchange section (112) to provide the cooling to the IT (114). As will be discussed below, each of these sections translated to a scalable module in accordance with embodiments disclosed herein. Each of these components and/or sections is described below.

The dry cooling section (108) includes one or more dry coolers (108A-108D). The number of dry coolers is not limited, and may be selected based on the cooling requirements and environment (i.e., geography, available space, etc.) The dry coolers are compressor-less coolers and/or evaporative coolers. The dry coolers may use an adiabatic process for cooling a liquid. The dry cooling section (108) includes monitoring and control components, for example dry cooling pumps (109A, 109B) and temperature monitors (115A, 115B).

In FIG. 1, the liquid loop interface (110) is an interface between the secondary loop (104) and the third loop (106). The liquid loop interface (110) includes one or more liquid heat exchange devices (CDUs) (110A . . . 110D). One of ordinary skill in the art will appreciate that the number of CDUs in the liquid loop interface (110) is not limited. The number of CDUs may be selected based on the cooling requirements of the IT, in conjunction with the number of dry coolers.

In these embodiments, the CDUs (110A-110D) provide liquid cooling to the IT (114) via the secondary loop (104). The third loop (106) provides liquid cooling to the CDUs (110A-110D) using dry coolers (108C, 108D) of the dry cooling section (108). For each CDU (110A-110D), a CDU pump (111A-111D) is provided to control the flow in secondary loop (104).

The primary loop (102) provides liquid cooling to the air to liquid exchange section (112). The cooled fluid from the dry cooling section (108) is used to remove heat from the air via an air to liquid heat exchange device (112A). One or more fans (113) may be used to direct the flow of air to and from the IT (114). One or more temperature sensors (115C, 115D) may be used to monitor and control the air temperature and air cooling conditions in the air to liquid exchange section (112). In the example of FIG. 1, the air system would be considered a closed system (i.e., closed off from any outside air). As will be apparent given the modular nature disclosed herein, embodiments disclosed herein are not limited to closed systems.

In the example of FIG. 1, the primary loop (102) includes two dry coolers (108A, 108B) of the dry cooling section (108) and the air to liquid heat exchange device (112A) of the air to liquid exchange section (112). The secondary loop (104) is the closed liquid loop that includes the CDUs (110A-110D) of the liquid loop interface (110) and the IT (114). The third loop (106) includes two dry coolers (108C, 108D) of the dry cooling section (108) and the CDUs (110A-110D) of the liquid loop interface (110).

In these examples, the primary loop (102) and third loop (106) follow separate paths through the dry cooling section (108). The dry cooling section (108) includes four dry coolers (108A-108D), and the loops are connected such that the primary loop (102) utilizes two of the dry coolers (108A, 108B) and the third loop (106) utilizes the remaining dry coolers (108C, 108D). However, as will be demonstrated below, embodiments disclosed herein are not limited to the number of loops utilizing the dry cooling section (108).

Embodiments of FIG. 1 demonstrate a scalable closed loop cooling solution that includes a primary liquid loop with compressor-less dry coolers that may include an evaporative cooling option for heat rejection to the outside environment, a secondary liquid loop to remove heat from the liquid cooled IT, and an air to liquid heat exchange device to remove heat from the air that provides air cooling to the IT in a single packaged cooling unit. The use of the dry coolers provides an energy efficient removal of heat for both liquid and air cooling sections. However, one of ordinary skill in the art will appreciate that the dry coolers may be replaced with mechanical cooling if lower liquid temperatures are required.

In embodiments disclosed herein, the liquid used in the cooling loops is not limited to any particular fluid. For example, distilled water, glycol solutions (e.g., ethylene glycol, propylene glycol) and mixtures thereof may be used in the cooling loops. Further, different fluids may be used in different cooling loops. For example, the primary cooling loop may use distilled water, while the secondary cooling loop uses a water/glycol mixture.

Those skilled in the art will appreciate that while FIG. 1 has been described as including specific numbers of various components, embodiments of technology are not limited to these specific quantities of components; rather, the technology may be implemented using any quantity of the various types of components.

Figure 2:
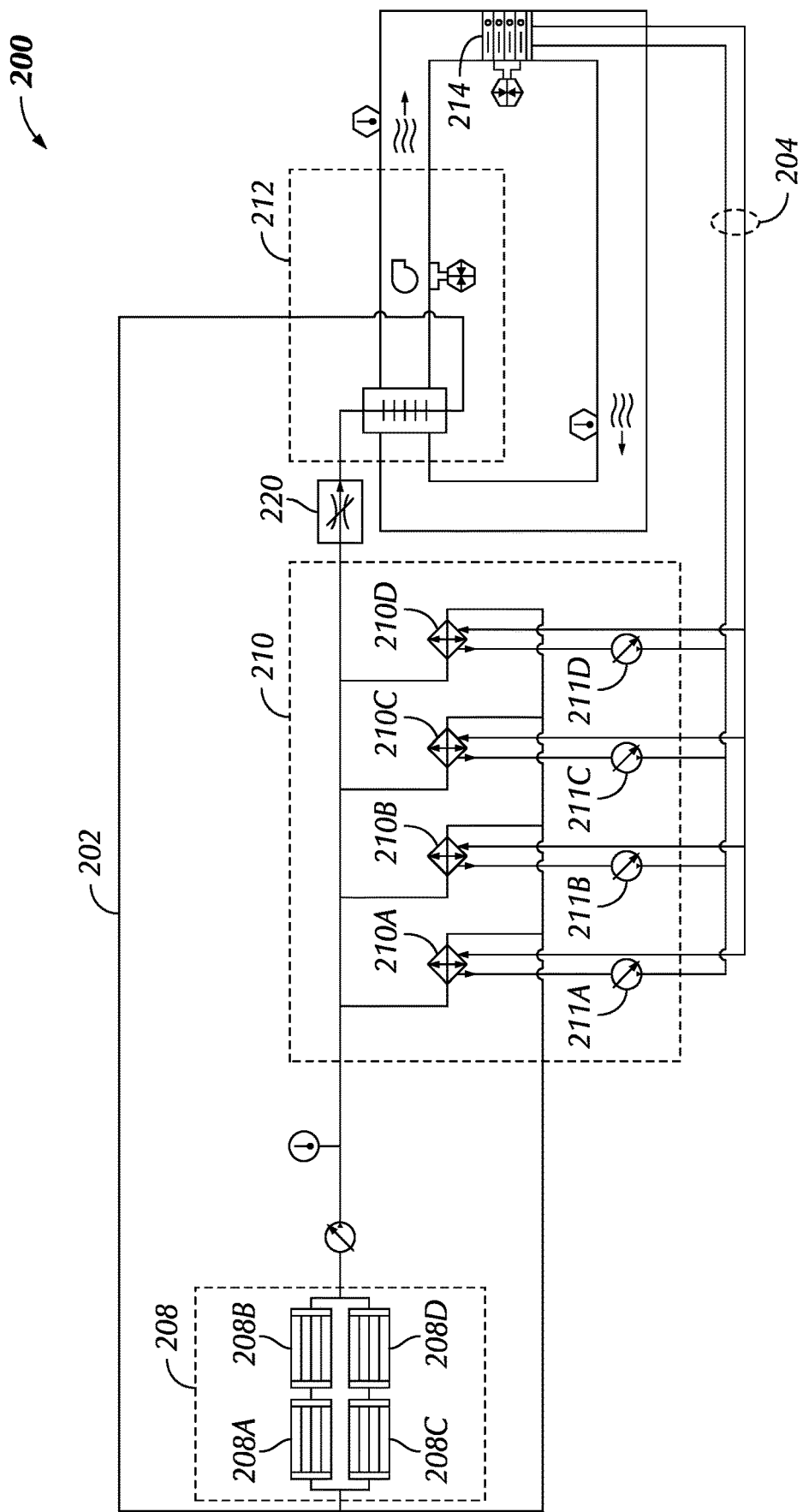
FIG. 2 shows a diagram of a dual loop system in accordance with one or more embodiments of the technology.

FIG. 2 shows a diagram of a dual loop system in accordance with one or more embodiments of the technology. The examples of the dual loop system (200) of FIG. 2 include a dry cooling section (208), a liquid loop interface (210), and an air to liquid exchange section (212) to provide the cooling to the IT (214), similar to the embodiment of FIG. 1.

In FIG. 2, the primary loop (202) includes the dry cooling section (208), the liquid loop interface (210), and the air to liquid exchange section (212). The secondary loop (204) is a closed liquid loop that includes the CDUs (210A-210D) of the liquid loop interface (210) and the IT (214). In FIG. 2, a flow control valve (220) controls the liquid flow in the primary loop (202).

In FIG. 2, the dry cooling section (208) includes four dry coolers (208A-208D) with two dry coolers (208A, 208B) being connected in parallel with the remaining dry coolers (208C, 208D). However, one of ordinary skill in the art will appreciate that the number and arrangement of the dry coolers is not limited.

In embodiments of FIG. 2, the flow control valve (220) may include an air temperature input from the air to liquid exchange section (212) to control the flow of liquid in the primary loop (202). In such embodiments, the flow control valve (220) of the primary liquid loop (202) may engineer the pressure and/or flow, in conjunction with the speed of the CDU pumps (211A-211D), to establish the desired air and liquid cooling.

Those skilled in the art will appreciate that while FIG. 2 has been described as including specific numbers of various components, embodiments of technology are not limited to these specific quantities of components; rather, the technology may be implemented using any quantity of the various types of components.

Figure 3:
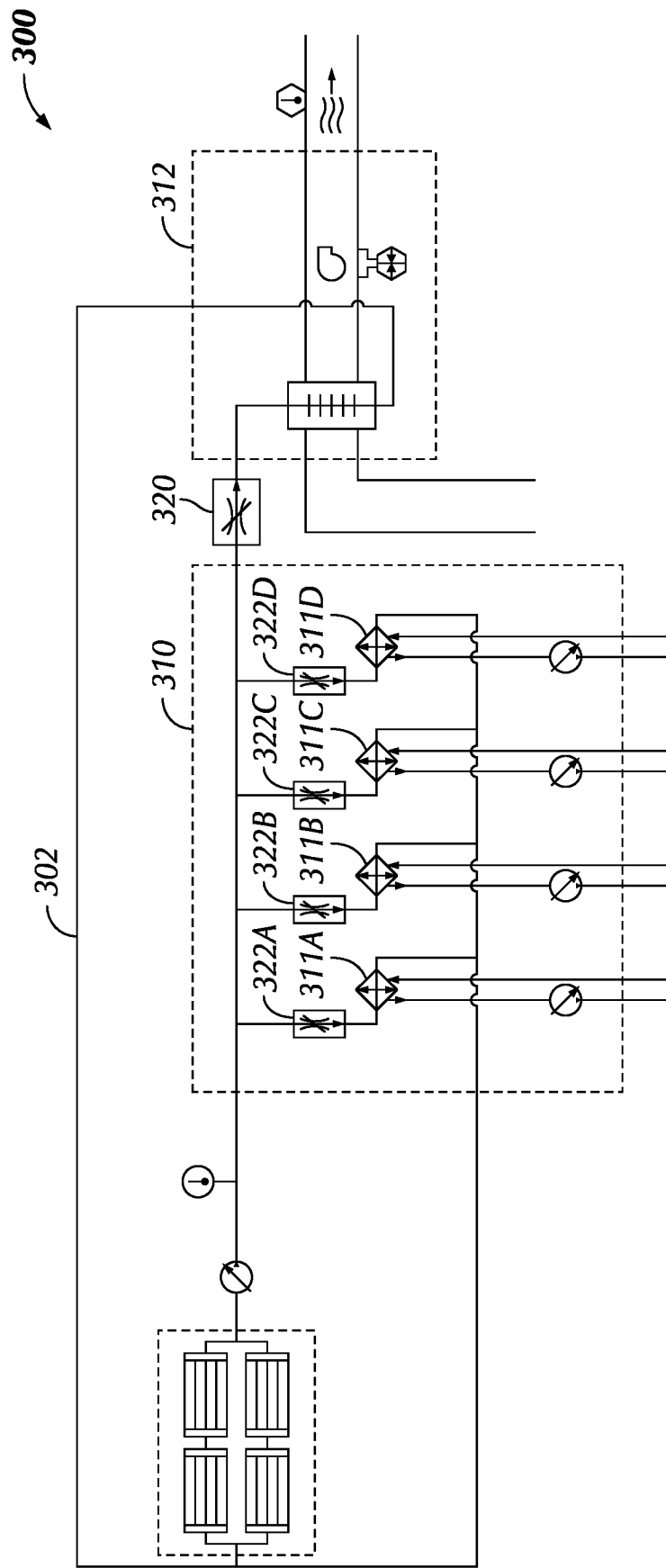
FIG. 3 shows a diagram of a system for adjusting the liquid/air cooling ratio in accordance with one or more embodiments of the technology.

FIG. 3 shows a diagram of a system for adjusting the liquid/air cooling ratio in accordance with one or more embodiments of the technology. The examples demonstrated by the system (300) of FIG. 3 is similar to that of FIG. 2, with the addition of CDU flow control valves (322A-322D) associated with the CDUs (310A-310D) in the primary loop (302). In FIG. 3, the number of CDU flow control valves (322A-322D) is shown as equal to the number of CDUs (310A-310D); however, embodiments are not limited as such. For example, one CDU control valve may service one or more CDUs in accordance with embodiments disclosed herein.

The flow control valves (320, 322A-322D) may be used to control the ratio of liquid cooling, via the secondary loop, to the air cooling provided by the air to liquid exchange section (312), via the primary loop. That is, the control valve (320) may be used to control the amount of cooling from air (via the air to liquid exchange section (312)). The control valves (322A-322D) may be used to control the amount of cooling from liquid (via the CDUs (311A-311D) of the liquid loop interface (410)).

Such embodiments provide direct control of the amount of cooling provided by both the liquid cooling and the air cooling. Embodiments may include an air temperature input from the air to liquid exchange section (312) to direct the flow of liquid in the primary loop (302) using the flow control valve (320). Embodiments may also use temperature monitoring in the CDUs (310A-310D), in conjunction with the CDU pumps (311A-311D), to control the cooling in the secondary loop via the CDU control valves (322A-322D).

Those skilled in the art will appreciate that while FIG. 3 has been described as including specific numbers of various components, embodiments of technology are not limited to these specific quantities of components; rather, the technology may be implemented using any quantity of the various types of components.

Figure 4:
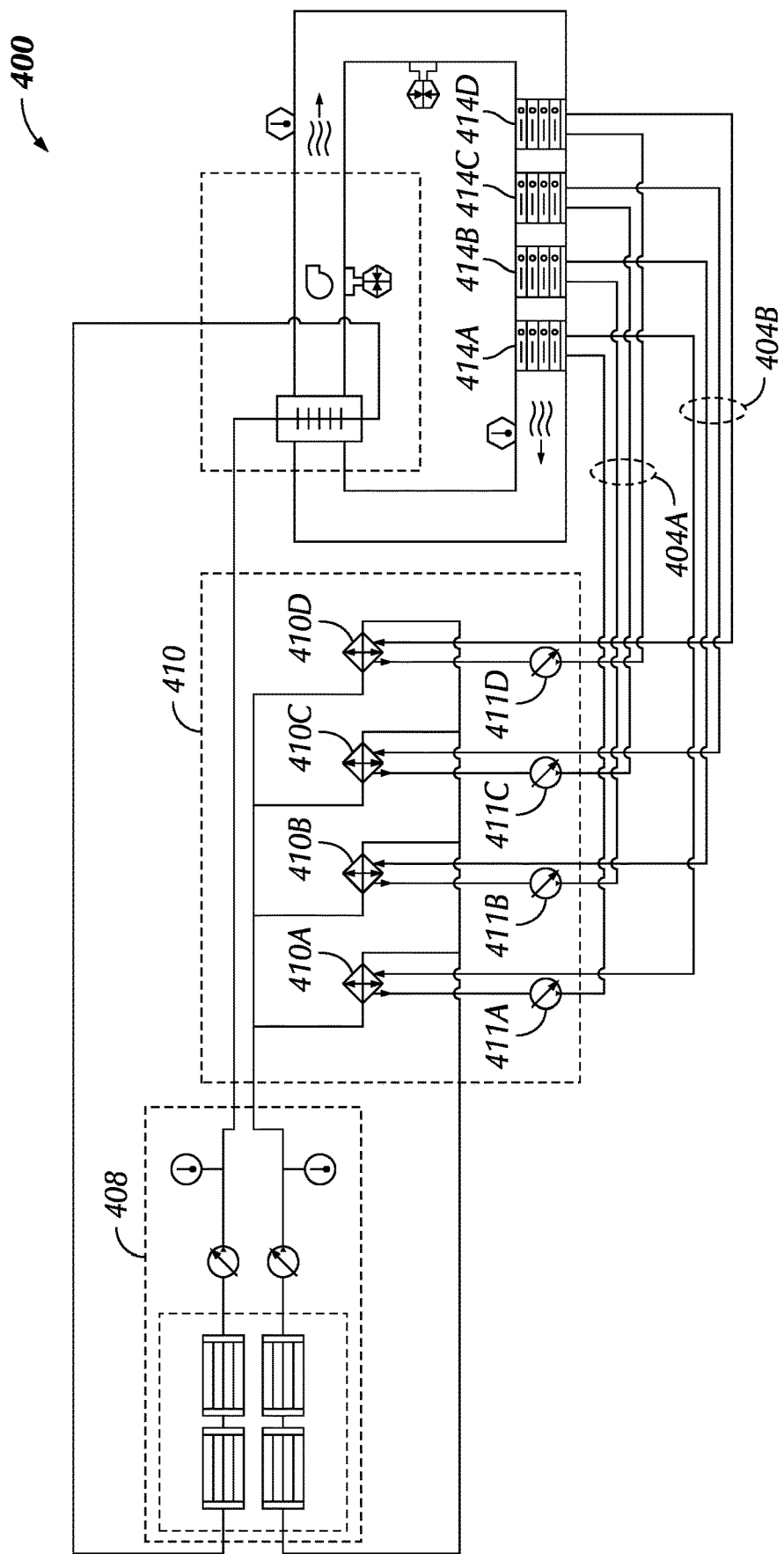
FIG. 4 shows a diagram of a multicomponent system in accordance with one or more embodiments of the technology.

FIG. 4 shows a diagram of a multicomponent system in accordance with one or more embodiments of the technology. The system (400) of FIG. 4 demonstrates that the secondary loop (404) may include multiple IT units (414A-414D). As shown in FIG. 4, a cooler side of the secondary loop (404A) follows a path from the CDUs (410A-410D) to the IT units (414A-414D), and a hotter side of the secondary path (404B) follows a path from the IT units (414A-414D) back to the CDUs (410A-410D).

In FIG. 4, the number of CDUs is shown with an equal number of IT units; however, embodiments disclosed herein are not limited as such. One of ordinary skill in the art will appreciate that one CDU may service one or more IT units, or more than one CDU may service a single IT unit. The CDU pumps (411A-411D) may be used to control the flow in the secondary loop (404) in accordance with the number and/or type of IT units (414A-414D) serviced by each of the CDUs (410A-410D). Further control may be established using CDU control valves as described in FIG. 2-3 in accordance with embodiments disclosed herein.

Those skilled in the art will appreciate that while FIG. 4 has been described as including specific numbers of various components, embodiments of technology are not limited to these specific quantities of components; rather, the technology may be implemented using any quantity of the various types of components.

The use of dry coolers and multi-loop configurations disclosed herein provide efficient scalable cooling systems. Embodiments disclosed herein have the effect of a Power Usage Effectiveness (PUE) near 1.0. In this context, the PUE refers to the ratio of total power to the IT power required. As such, the most efficient PUE is a value of 1.0, while less efficient systems exhibit a PUE of greater than 1.0. The PUE of previous systems is typically above 1.5, prior to embodiments disclosed herein. Embodiments disclosed herein have a PUE may have a PUE less than 1.3. Some embodiments disclosed herein may exhibit a PUE less than 1.1. Embodiments disclosed herein may exhibit a PUE of 1.01-1.05.

Figure 5:
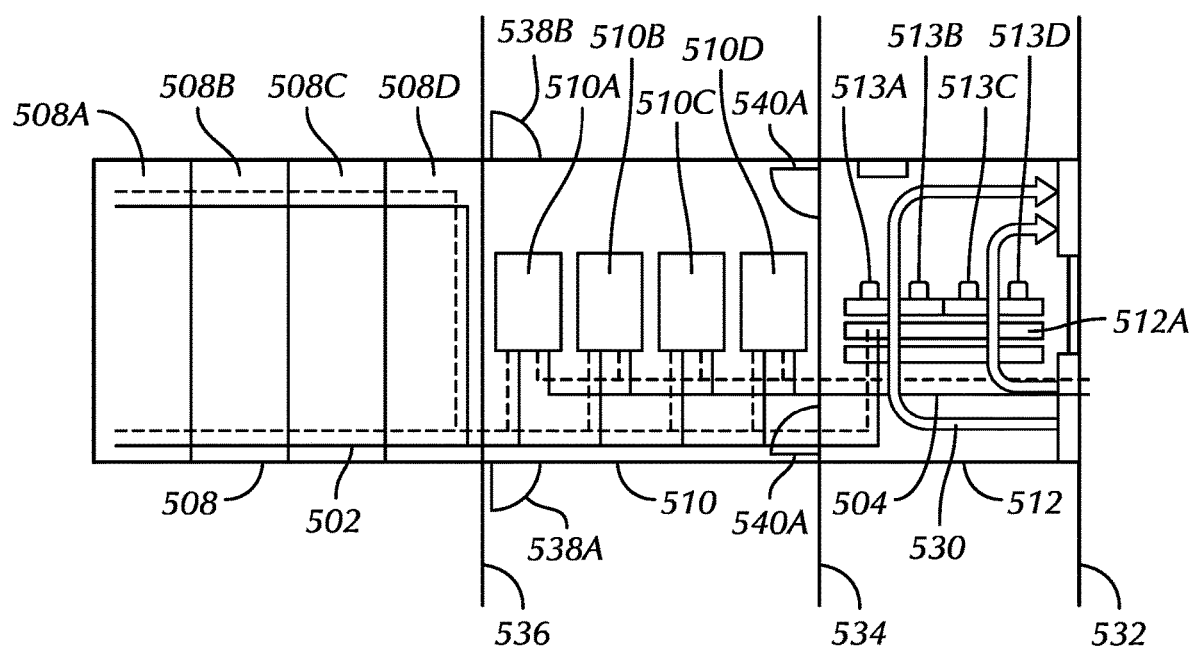
FIG. 5 shows a diagram of a modular system in accordance with one or more embodiments of the technology.

FIG. 5 shows a diagram of a modular system in accordance with one or more embodiments of the technology. In the system (500), the dry cooling module (508) includes four dry coolers (508A-508D). The liquid interface module (510) includes four CDUs (510A-510D). The air to liquid module (512) includes an air to liquid heat exchange device (512A) with multiple fans (513A-513D). The primary liquid loop (502) includes the dry coolers (508A-508D), the CDUs (510A-510D), and the air to liquid heat exchange device (512A). The secondary loop (504) includes the CDUs (510A-510D) and IT units (not shown). As indicated by the secondary liquid loop (504) and the air flow (530), the one or more IT units are located to the right of FIG. 5.

Figure 7:
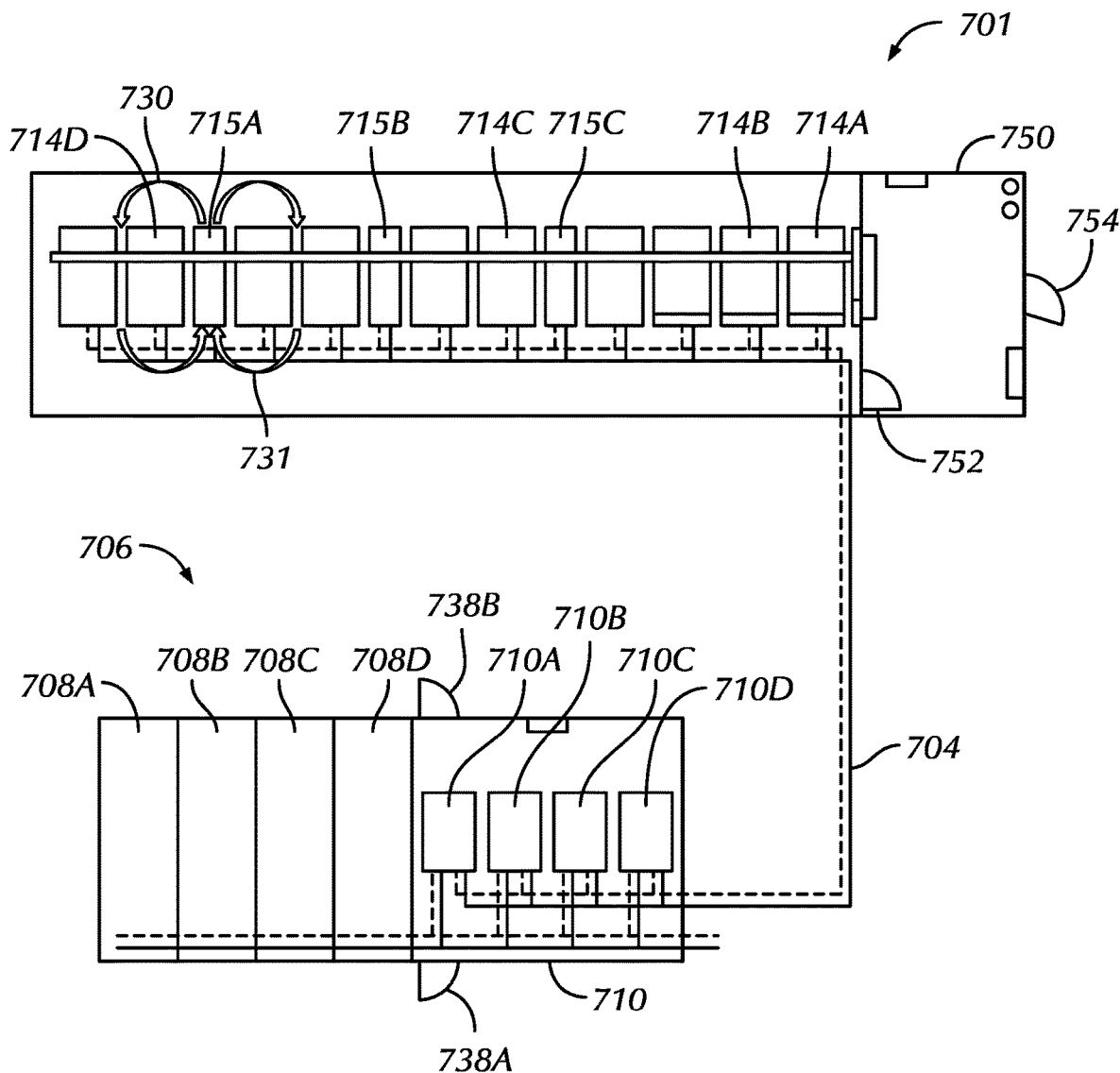
FIG. 7 shows a modular system in accordance with one or more embodiments of the technology

The dry cooling module (508), liquid interface module (510), and air to liquid module (512) may be established together, as shown in FIG. 7, or each individual module may be established separately as indicated by the module splits (532, 534, 536). For example, the dry cooling module (508) may be established separately from the liquid interface module (510). Then, the dry cooling module (508) and the liquid interface module (510) may be connected at the module split (536). Similarly, the air to liquid module (512) may be established separately from the liquid interface module (510). Then, the air to liquid module (512) may be connected to the liquid interface module (510) at the module split (534). One of ordinary skill in the art will appreciate that the order in which the modules are connected is not limited.

In embodiments disclosed herein, the number of connections between the modules primarily consists of liquid connections to establish the multiple liquid loops. Other connections, such as power supply lines and/or sensor lines, may also traverse the module splits in accordance with embodiments disclosed herein.

In FIG. 5, the liquid interface module (510) includes access points (538A, 538B) to access the CDUs (510A-510D) from outside the system. Further, the air to liquid module (512) may be accessed using access points (540A, 540B) through the liquid interface module (510). The access points (538A, 538B, 540A, 540B) allow access for setting up the modules, as well as service and maintenance of the modules.

FIG. 5 demonstrates the modular aspects of the cooling system in accordance with embodiments disclosed herein. The modules may be constructed individually in accordance with embodiments disclosed herein. The modules may be deployed to a site individually, or assembled prior to deployment to the site. The modules, assembled or individually, may be established on a skid and transported to the site in accordance with embodiments disclosed herein. The modules may include integrated shock/vibration isolation to aide in the transportation of modules and deployment.

Those skilled in the art will appreciate that while FIG. 5 has been described as including specific numbers of various components, embodiments of technology are not limited to these specific quantities of components; rather, the technology may be implemented using any quantity of the various types of components.

The modules may be scaled to accommodate the different needs for heterogeneous IT environments. FIGS. 6.1-6.4 show diagrams demonstrating the scalability of a system in accordance with one or more embodiments of the technology.

In FIG. 6.1, the dry cooling module (608) includes one dry cooler (608A); the liquid interface module (610) includes one CDU (610A); and the air to liquid module (612) includes an air to liquid heat exchange device (612A) with one fan (613A). The primary liquid loop (602) includes the dry cooler (608A), the CDU (610A), and the air to liquid heat exchange device (612A). The secondary loop (604) includes the CDU (610A) and IT units (not shown). FIG. 6.1 represents a minimal cooling system that may be assembled and deployed on a single skid transported by conventional means.

In FIG. 6.2, the dry cooling module (608) includes two dry coolers (608A, 608B); the liquid interface module (610) includes two CDUs (610A, 610B); and the air to liquid module (612) includes an air to liquid heat exchange device (612A) with two fans (613A, 613B). The primary liquid loop (602) includes the dry coolers (608A, 608B), the CDUs (610A, 610B), and the air to liquid heat exchange device (612A). The secondary loop (604) includes the CDUs (610A, 610B) and IT units (not shown).

In FIG. 6.3, the dry cooling module (608) includes three dry coolers (608A, 608B, 608C); the liquid interface module (610) includes three CDUs (610A, 610B, 610C); and the air to liquid module (612) includes an air to liquid heat exchange device (612A) with three fans (613A, 613B, 613C). The primary liquid loop (602) includes the dry coolers (608A, 608B, 608C), the CDUs (610A, 610B, 610C), and the air to liquid heat exchange device (612A). The secondary loop (604) includes the CDUs (610A, 610B, 610C) and IT units (not shown).

In FIG. 6.4, the dry cooling module (608) includes four dry coolers (608A-608D); the liquid interface module (610) includes four CDUs (610A-610D); and the air to liquid module (612) includes an air to liquid heat exchange device (612A) with four fans (613A-613D). The primary liquid loop (602) includes the dry coolers (608A-608D), the CDUs (610A-610D), and the air to liquid heat exchange device (612A). The secondary loop (604) includes the CDUs (610A-610D) and IT units (not shown).

Although FIGS. 6.1-6.4 show an equal number of dry coolers, CDUs, and fans, embodiments disclosed herein are not limited as such. For example, the number of fans may outnumber the number of CDUs and/or dry coolers. Further, the number of CDUs may outnumber the number of dry coolers, or vice versa. Rather, FIGS. 6.1-6.4 demonstrate that each module is scalable according to the desired cooling, available space, and deployment strategies in accordance with embodiments disclosed herein.

FIG. 7 shows a modular system in accordance with one or more embodiments of the technology. FIG. 7 demonstrates a cooling module (700) connected to an IT module (701). The cooling module (700) may include any of the cooling disclosed herein. In the example of FIG. 7, the cooling module (700) includes a dry cooling module (708) which includes four dry coolers (708A-708D), and a liquid interface module (710) that further includes four CDUs (710A-710D). The liquid interface module (710) includes access points (738A, 738B) to access the CDUs (710A-710D) from outside of the module.

The cooling module (700) is connected to an IT module (701) in accordance with one or more embodiments disclosed herein. In the example of FIG. 7, the cooling module (700) is connected to the IT module (701) via a secondary loop (704) that supplies cooling liquid to the one or more IT units (714A-714D) in the IT module (701). In the embodiments of FIG. 7, as no air to liquid module is included, embodiments may include one or more in-row air coolers (715A-715C). The in-row air coolers (715A-715C) may produce air cooling to the IT units (714A-714D) by establishing air flow to create a cold side (730) and a hot side (731) of the IT module (701).

The IT module (701) may include a utility room (750) in accordance with one or more embodiments disclosed herein. The utility room (750) may provide access (752) to the IT units (714A-714D) and in-row air coolers (715A-715C), as well as access (754) to outside the system.

Embodiments of FIG. 7 demonstrate one deployment of the modular system disclosed herein that includes a cooling module installed parallel to an IT module that uses in-row coolers. FIG. 7 also demonstrates embodiments that do not include an air handler section, such as an air to liquid exchange module. Further, embodiments disclosed herein are not limited to the use of IT modules. Embodiments may be deployed to provide liquid cooling to different types of facilities, in addition to the IT modules disclosed herein. For example, embodiments may be deployed for installation into pre-existing air cooled facilities.

Figure 8:
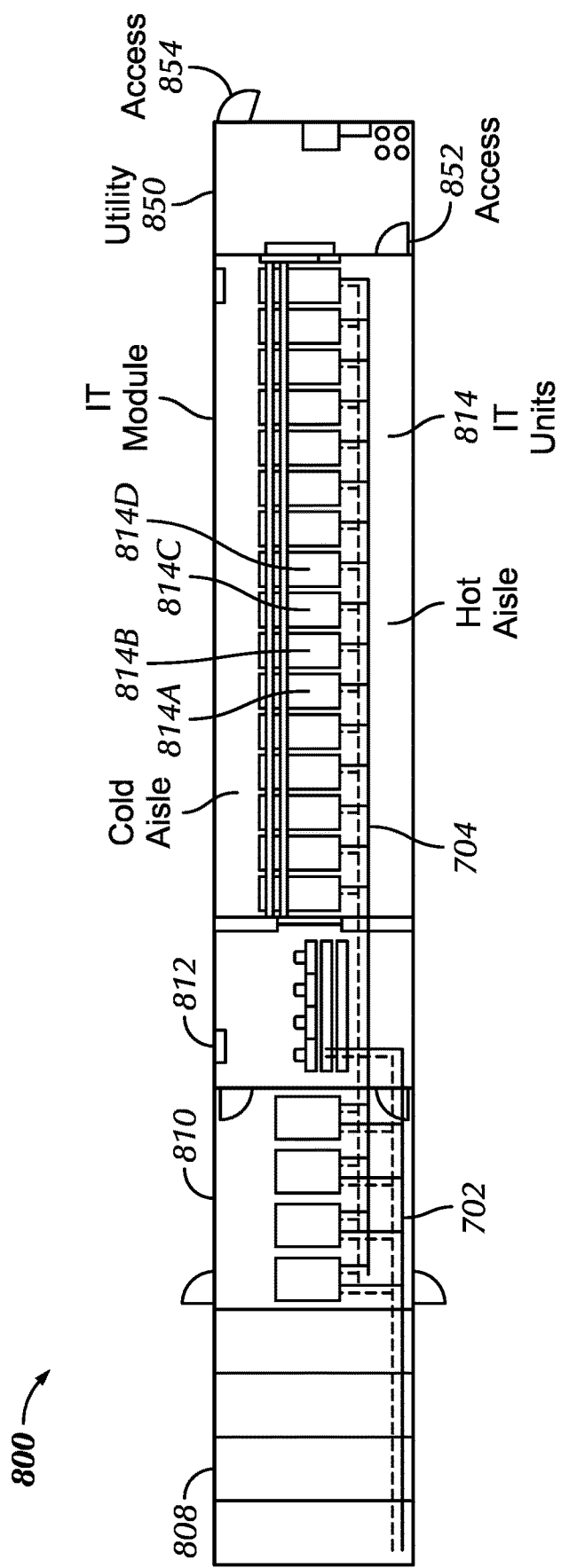
FIG. 8 shows a complete modular system in accordance with one or more embodiments of the technology.

FIG. 8 demonstrates other deployments of the modular system in accordance with one or more embodiments of the technology. In FIG. 8, the system (800) includes a dry cooling section (808), a liquid loop interface (810), and an air to liquid exchange section (812) that provide cooling to the IT section (814). The liquid loop interface (810), air to liquid exchange section (812), and IT section (814) are connected into one unit. The IT section (814) may include a utility room (850) that provides access (852) to the IT units (814A-814D), as well as access (854) to outside the system. In some embodiments, the utility room (850) may vary in size and/or may be a separate module.

Considering the embodiments disclosed in FIGS. 5-6, the embodiments of FIG. 8 may be assembled and shipped for deployment on a single skid in accordance with embodiments disclosed herein.

In other embodiments, the sections (i.e., the dry cooling section (808), the liquid loop interface (810), the air to liquid exchange section (812), and the IT section (814)) may be partially assembled onto one or more skids for deployment. For example, the dry cooling section (808) and liquid loop interface (810) may be assembled and deployed on a single skid, or the dry cooling section (808), the liquid loop interface (810), and air to liquid exchange section (812) may be assembled and then deployed on a single skid. In such embodiments, the final assembly of the system (800) may be completed at the deployment destination.

Embodiments disclosed herein provide an efficient, modular, liquid and/or air cooling system. The modular and scalable versatility of embodiments disclosed herein provides for efficient liquid and closed air cooling system suitable for many heterogeneous deployments. Embodiments disclosed herein provide a combination of liquid and air cooling, where the ratio of cooling provided by the liquid to air may be controlled. Embodiments disclosed herein also provide a system with a PUE of slightly greater than one. Embodiments of the modular system may provide cooling facilities, with or without air handling sections, which may be deployed to accommodate existing facilities that contain IT.

While the technology has been described above with respect to a limited number of embodiments, those skilled in the art, having the benefit of this disclosure, will appreciate that other embodiments can be devised which do not depart from the scope of the technology as disclosed herein. Accordingly, the scope of the technology should be limited only by the attached claims.

What is claimed is:

1. A modular system for cooling Information Technology (IT), the system comprising:
   a first section comprising four dry coolers configured to provide a cooled fluid to a second section and a third section via a primary liquid cooling loop, wherein the dry coolers are configured to remove heat to an outside environment of a facility in which an IT unit is located;
   the second section comprising four cooling distribution units (CDUs), wherein the four CDUs are configured to receive cooling by exchanging heat with at least some of the cooled fluid within the primary liquid cooling loop, and transfer the cooling to the IT unit to provide direct liquid cooling via a secondary liquid cooling loop, wherein the secondary liquid cooling loop is connected to the IT unit and the four CDUs;
   the third section comprising a liquid heat exchange device, wherein the liquid heat exchange device is configured to exchange heat between at least some of the cooled fluid and an air of the facility, wherein:
   the air is usable to cool the IT unit,
   the air is flowed to and from the IT unit by one or more fans, and
   a temperature of the air is monitored by one or more temperature sensors disposed in the facility;
   four CDU pumps disposed on the secondary liquid cooling loop to control a flow in the secondary liquid cooling loop; and
   a flow control valve disposed on the primary liquid cooling loop configured, along with the four CDU pumps, to engineer a pressure and a flow of cooling fluid in the primary liquid cooling loop to establish desired air and liquid cooling, wherein the temperature monitored by the one or more temperature sensors is used to determine control of the cooled fluid in the primary liquid cooling loop.

2. The system of claim 1, wherein the facility is a pre-existing air cooled environment comprising the IT unit.

3. The system of claim 1, wherein the first section is configured to receive additional dry coolers; and wherein the second section is configured to receive additional CDUs.

4. The system of claim 1, wherein the dry coolers of the first section may be compressor-less dry coolers and may include evaporative cooling options.

5. The system of claim 1, wherein a Power Usage Effectiveness (PUE) value of the system may range from 1.01 to 1.3.

6. A device for cooling Information Technology (IT), the device comprising:
   a first section comprising four dry coolers configured to provide a cooled fluid to a second section and a third section via a primary liquid cooling loop, wherein the dry coolers are configured to remove heat to an outside environment of a facility in which an IT unit is located;
   the second section comprising four cooling distribution units (CDUs), wherein the four CDUs are configured to receive cooling by exchanging heat with at least some of the cooled fluid within the primary liquid cooling loop, and transfer the cooling to the IT unit to provide direct liquid cooling via a secondary liquid cooling loop, wherein the secondary liquid cooling loop is connected to the IT unit and the four CDUs;
   the third section comprising a liquid heat exchange device, wherein the liquid heat exchange device is configured to exchange heat between at least some of the cooled fluid and an air of the facility, wherein:
   the air is usable to cool the IT unit,
   the air is flowed to and from the IT unit by one or more fans, and
   a temperature of the air is monitored by one or more temperature sensors disposed in the facility;
   four CDU pumps disposed on the secondary liquid cooling loop to control a flow in the secondary liquid cooling loop; and
   a flow control valve disposed on the primary liquid cooling loop configured, along with the four CDU pumps, to engineer a pressure and a flow of cooling fluid in the primary liquid cooling loop to establish desired air and liquid cooling wherein the temperature monitored by the one or more temperature sensors is used to determine control of the cooled fluid in the primary liquid cooling loop.

7. The device of claim 6, wherein the facility is a pre-existing air cooled environment comprising the IT unit.

8. The device of claim 6, wherein the dry coolers of the first section may be compressor-less dry coolers and may include evaporative cooling options.

* * * * *